(12) United States Patent
Luan et al.

(10) Patent No.: US 10,916,614 B2
(45) Date of Patent: Feb. 9, 2021

(54) ARRAY SUBSTRATE, DISPLAY PANEL, LIGHT-DETECTING METHOD THEREFOR AND METHOD FOR CONTROLLING THE SAME

(71) Applicants: HEFEI XINSHENG OPTOELECTRONICS TECHNOLOGY CO., LTD., Hefei (CN); BOE TECHNOLOGY GROUP CO., LTD., Beijing (CN)

(72) Inventors: Mengyu Luan, Beijing (CN); Yuching Peng, Beijing (CN); Youyuan Hu, Beijing (CN); Zhongsheng Qi, Beijing (CN); Bo Mao, Beijing (CN); Fei Li, Beijing (CN); Jianhui Zhang, Beijing (CN); Xinfeng Wu, Beijing (CN); Huihui Li, Beijing (CN); Xinzhu Wang, Beijing (CN)

(73) Assignees: HEFEI XINSHENG OPTOELECTRONICS TECHNOLOGY CO., LTD., Anhui (CN); BOE TECHNOLOGY GROUP CO., LTD., Beijing (CN)

( * ) Notice: Subject to any disclaimer, the term of this patent is extended or adjusted under 35 U.S.C. 154(b) by 0 days.

(21) Appl. No.: 16/381,124

(22) Filed: Apr. 11, 2019

(65) Prior Publication Data
US 2020/0027941 A1 Jan. 23, 2020

(30) Foreign Application Priority Data
Jul. 20, 2018 (CN) .......................... 2018 1 0809423

(51) Int. Cl.
*H01L 27/32* (2006.01)
*G09G 3/3225* (2016.01)
(Continued)

(52) U.S. Cl.
CPC ....... *H01L 27/3269* (2013.01); *G09G 3/3225* (2013.01); *H01L 27/1446* (2013.01);
(Continued)

(58) Field of Classification Search
CPC ... G09G 2320/0233; G09G 2320/0626; G09G 2360/148; G09G 2360/16; G09G 3/3225;
(Continued)

(56) References Cited

U.S. PATENT DOCUMENTS 6,392,617 B1 * 5/2002 Gleason ............... G09G 3/3233 345/207
6,424,326 B2 * 7/2002 Yamazaki ............ G09G 3/3233 345/77
(Continued)

*Primary Examiner* — Richard J Hong
(74) *Attorney, Agent, or Firm* — Kinney & Lange, P.A.

(57) ABSTRACT

An array substrate, a display panel, a light-detecting method for a display panel, and a method for controlling a display panel are provided. The array substrate includes a base substrate; a plurality of pixel regions arranged in an array on the base substrate, the pixel regions each including a light-emitting region; and a light-detecting circuit in at least one pixel region, the light-detecting circuit configured to detect light emitted from the light-emitting region of the at least one pixel region in which the light-detecting circuit is provided.

13 Claims, 15 Drawing Sheets

(51) Int. Cl.
  *H01L 27/144* (2006.01)
  *H01L 31/02* (2006.01)
  *H01L 31/0216* (2014.01)
  *H01L 31/09* (2006.01)

(52) U.S. Cl.
  CPC ...... *H01L 27/3213* (2013.01); *H01L 27/3276* (2013.01); *H01L 31/02016* (2013.01); *H01L 31/0216* (2013.01); *H01L 31/09* (2013.01); *G09G 2320/0233* (2013.01); *G09G 2320/0626* (2013.01); *G09G 2360/148* (2013.01); *G09G 2360/16* (2013.01)

(58) Field of Classification Search
  CPC .. G09G 3/3233; G09G 3/3413; G09G 3/3648; H01L 27/1446; H01L 27/3269; H01L 27/3276; H01L 27/3213; H01L 31/02016; H01L 31/0216; H01L 31/09; G06F 3/042; G06F 3/0412; G06F 3/0488
  See application file for complete search history.

(56) References Cited

U.S. PATENT DOCUMENTS

| | | | |
|---|---|---|---|
| 2004/0046900 A1* | 3/2004 | Boer | G06F 3/0488 349/43 |
| 2006/0007204 A1* | 1/2006 | Reddy | G06F 3/042 345/204 |
| 2011/0074750 A1* | 3/2011 | Leon | G09G 3/3233 345/207 |
| 2011/0198484 A1* | 8/2011 | Kurokawa | G09G 3/3648 250/214 R |
| 2013/0194199 A1* | 8/2013 | Lynch | G06F 3/0412 345/173 |
| 2017/0061903 A1* | 3/2017 | Yata | G09G 3/3413 |
| 2019/0214448 A1* | 7/2019 | Hu | H01L 27/3269 |

* cited by examiner

ARRAY SUBSTRATE, DISPLAY PANEL, LIGHT-DETECTING METHOD THEREFOR AND METHOD FOR CONTROLLING THE SAME

CROSS-REFERENCE TO RELATED APPLICATION

This application claims the benefit of Chinese Patent Application No. 201810809423.6 filed on Jul. 20, 2018 in the State Intellectual Property Office of China, the whole disclosure of which is incorporated herein by reference.

TECHNICAL FIELD

The present disclosure relates to the field of display technologies, and in particular, to an array substrate, a display panel, a light-detecting method for a display panel, and a method for controlling a display panel.

BACKGROUND

Luminance uniformity is one of the key indicators to measure quality of display panels. Luminance non-uniformity is presented in conventional display panels, that is, the conventional display panels may have poor luminance uniformity. For example, in OLED display panels, due to some uncontrollable factors such as manufacturing process instability, parameter drift, and device aging of thin film transistors (i.e., TFTs) and organic light-emitting diodes (i.e., OLEDs), currents flowing through the organic light-emitting diodes may be changed, as a result, the luminance non-uniformity is presented in the display panels.

SUMMARY

In an aspect, an array substrate is provided including a base substrate; a plurality of pixel regions arranged in an array on the base substrate, the pixel regions each including a light-emitting region; and a light-detecting circuit in at least one pixel region, the light-detecting circuit configured to detect light emitted from the light-emitting region of the at least one pixel region in which the light-detecting circuit is provided.

Optionally, the light-detecting circuit includes a photosensitive element and an auxiliary circuit coupled to the photosensitive element, the photosensitive element located in the light-emitting region of the at least one pixel region.

Optionally, the photosensitive element includes a photoresistor, and the auxiliary circuit includes a first transistor and a first capacitor, and a gate electrode of the first transistor is electrically connected to a first gate scan line, one of a source electrode and a drain electrode of the first transistor is electrically connected to a signal line for supplying a driving voltage, and the other one of the source electrode and the drain electrode of the first transistor is electrically connected to one end of the photoresistor, and the other end of the photoresistor is electrically connected to one end of the first capacitor.

Optionally, the plurality of pixel regions include at least one white sub-pixel, the white sub-pixel configured to emit white light, and the photosensitive element includes a first photoresistor, a second photoresistor and a third photoresistor, and the first photoresistor, the second photoresistor and the third photoresistor are all located in a light-emitting region of the white sub-pixel.

Optionally, the first photoresistor includes a first photoresistor material sensitive to a first primary color, the second photoresistor includes a second photoresistor material sensitive to a second primary color, and the third photoresistor includes a third photoresistor material sensitive to a third primary color.

Optionally, the auxiliary circuit includes: a first transistor, a second transistor, and a third transistor; and a first capacitor, a second capacitor, and a third capacitor. A gate electrode of the first transistor, a gate electrode of the second transistor, and a gate electrode of the third transistor are electrically connected to a first gate scan line respectively. One of a source electrode and a drain electrode of the first transistor, one of a source electrode and a drain electrode of the second transistor, and one of a source electrode and a drain electrode of a third transistor are electrically connected to a signal line for supplying a driving voltage respectively. The other one of the source electrode and the drain electrode of the first transistor is electrically connected to one end of the first photoresistor, and the other end of the first photoresistor is electrically connected to one end of the first capacitor. The other one of the source electrode and the drain electrode of the second transistor is electrically connected to one end of the second photoresistor, and the other end of the second photoresistor is electrically connected to one end of the second capacitor. The other one of the source electrode and the drain electrode of the third transistor is electrically connected to one end of the third photoresistor, and the other end of the third photoresistor is electrically connected to one end of the third capacitor.

Optionally, the first photoresistor is located at one position selected from a central position of the light-emitting region of the white sub-pixel in a first direction, a central position of the light-emitting region of the white sub-pixel in a second direction different from the first direction, or an edge position of the light-emitting region of the white sub-pixel. The second photoresistor is located at one position selected from the central position of the light-emitting region of the white sub-pixel in the first direction, the central position in the light-emitting region of the white sub-pixel in the second direction, or the edge position of the light-emitting region of the white sub-pixel. The third photoresistor is located at one position selected from the central position of the light-emitting region of the white sub-pixel in the first direction, the central position in the light-emitting region of the white sub-pixel in the second direction, or the edge position of the light-emitting region of the white sub-pixel.

Optionally, the plurality of pixel regions include: a first primary color sub-pixel configured to emit light of a first primary color; a second primary color sub-pixel configured to emit light of a second primary color; and a third primary color sub-pixel configured to emit light of a third primary color; the array substrate includes a plurality of the light-detecting circuits, the plurality of light-detecting circuits including at least one of a first light-detecting circuit, a second light-detecting circuit, or a third light-detecting circuit; and the first light-detecting circuit is disposed in the first primary color sub-pixel, the second light-detecting circuit is disposed in the second primary color sub-pixel, and the third light-detecting circuit is disposed in the third primary color sub-pixel.

Optionally, the array substrate includes a luminescent material layer on the base substrate, and an orthographic projection of the photosensitive element on the base substrate overlaps with an orthographic projection of the luminescent material layer on the base substrate.

Optionally, the array substrate further includes a light absorbing layer on the photoresistor.

Optionally, the array substrate is a bottom emission type OLED array substrate, the bottom emission type OLED array substrate includes a luminescent material layer on the base substrate, and the photosensitive element is disposed between the base substrate and the luminescent material layer.

Optionally, the array substrate is a top emission type OLED array substrate, the top emission type OLED array substrate includes a luminescent material layer on the base substrate, and the photosensitive element is disposed on a side of the luminescent material layer away from the base substrate.

In another aspect, a display panel is provided including the array substrate as described above.

In a further aspect, a display panel is provided including: an array substrate including a plurality of pixel regions arranged in an array, the pixel regions each including a light-emitting region; an opposite substrate opposite to the array substrate; and a light-detecting circuit on the opposite substrate and configured to detect light emitted from the light-emitting region of at least one of the plurality of pixel regions.

Optionally, the opposite substrate includes a first region, an orthographic projection of the first region on the array substrate coinciding with an orthographic projection of light-emitting regions of the plurality of pixel regions on the base substrate; and the light-detecting circuit includes a photosensitive element and an auxiliary circuit coupled to the photosensitive element, the photosensitive element located in the first region of the opposite substrate.

Optionally, the array substrate is a top emission type OLED array substrate.

In another further aspect, a light-detecting method is provided for a display panel, the display panel including: a plurality of pixel regions arranged in an array; and a light-detecting circuit in at least one pixel region, the light-detecting circuit including a photoresistor, wherein the light-detecting method includes: detecting a resistance value of the photoresistor; and calculating an intensity of light emitted from the at least one pixel region in which the light-detecting circuit is provided, according to a mapping relationship between the resistance value of the photoresistor and the intensity of the light emitted from the at least one pixel region.

Optionally, the plurality of pixel regions include at least one white sub-pixel configured to emit white light, and the light-detecting circuit includes a first photoresistor, a second photoresistor, and a third photoresistor, wherein detecting the resistance value of the photoresistor includes: detecting a resistance value of the first photoresistor in the white sub-pixel; detecting a resistance value of the second photoresistor in the white sub-pixel; and detecting a resistance value of the third photoresistor in the white sub-pixel.

Optionally, calculating the intensity of light emitted from the at least one pixel region in which the light-detecting circuit is provided according to the mapping relationship between the resistance value of the photoresistor and the intensity of the light emitted from the at least one pixel region includes: calculating an intensity of light emitted from the white sub-pixel, according to a first mapping relationship between the resistance value of the first photoresistor and the intensity of light emitted from the white sub-pixel, a second mapping relationship between the resistance value of the second photoresistor and the intensity of light emitted from the white sub-pixel and a third mapping relationship between the resistance value of the third photoresistor and the intensity of the light emitted from the white sub-pixel.

In still another further aspect, a method is provided for controlling a display panel which includes: performing the light-detecting method as described above; calculating a deviation between the intensity of light emitted from the at least one pixel region and a design value of intensity of light emitted from the at least one pixel region; and compensating for the light emitted from the at least one pixel region according to the deviation.

BRIEF DESCRIPTION OF THE DRAWINGS

Objects and advantages of the present disclosure will be apparent from the following descriptions with reference to accompanying drawings, which are helpful to provide a comprehensive understanding of the present disclosure.

Figure 1:
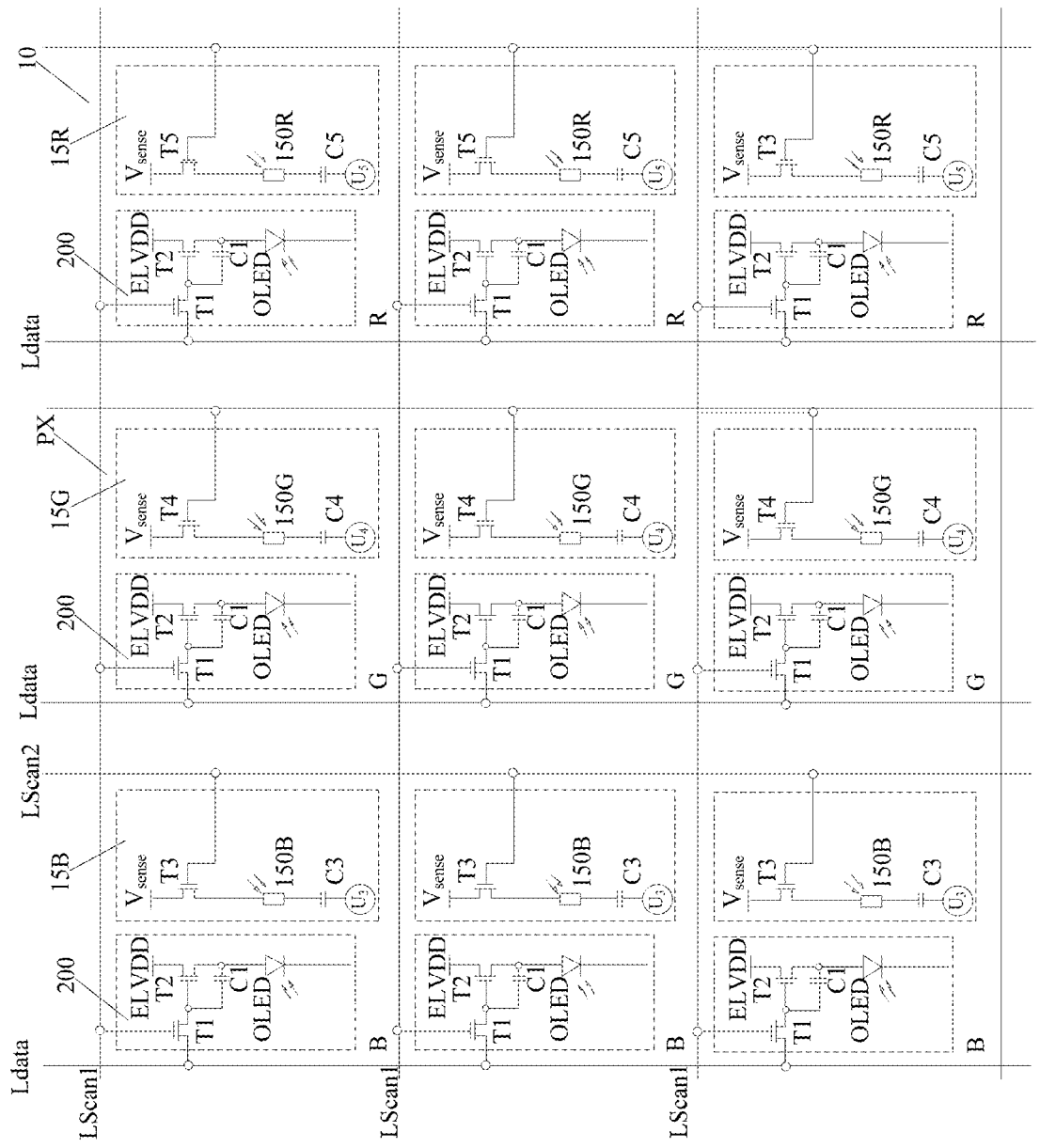
FIG. 1 is a schematic view of an array substrate according to some exemplary embodiments of the present disclosure, in which a pixel arrangement is shown.

It is to be noted that scales of layers, structures or regions may be enlarged or reduced in the drawings for describing the embodiments of the present disclosure, that is, the drawings are not drawn to actual scales.

DETAILED DESCRIPTION OF EMBODIMENTS

Technical solutions of the present disclosure will be further described below in details by way of embodiments with reference to accompanying drawings. In the specification, the same or similar reference numerals indicate the same or similar parts. The following descriptions of the embodiments of the present disclosure are intended to explain a general inventive concept of the present disclosure, and not to be construed as limiting the present disclosure.

In the following detailed descriptions, numerous specific details are set forth to facilitate explaining the present disclosure so as to provide a comprehensive understanding of the embodiments of the present disclosure. Obviously, however, one or more embodiments may be practiced without these specific details.

As used herein, directional expressions such as "first direction" and "second direction" are used to describe different directions along a pixel region, for example, a longitudinal direction and a lateral direction of the pixel region. It is to be understood that such expressions are merely illustrative and are not intended to be limiting the present disclosure.

As used herein, a "light-emitting region" of a pixel unit, a pixel region, or a sub-pixel refers to a partial region of the pixel unit, the pixel region or the sub-pixel where light is emitted out. For example, for an OLED display device, in one of its pixel units, pixel regions or sub-pixels, an OLED element is located in its light-emitting region while a thin film transistor is located in its non-light-emitting region.

As shown in FIG. 1, an organic electroluminescent display panel, for example, an OLED display panel, according to some exemplary embodiments of the present disclosure may include: an array substrate 10, a plurality of gate scan signal lines LScan1, a plurality of data signal lines LData, and a plurality of pixel regions PX arranged in an array. The plurality of gate scan signal lines LScan1 and the plurality of data signal lines LData are disposed on the array substrate 10. The plurality of gate scan signal lines LScan1 cross with the plurality of data signal lines LData to form the plurality of pixel regions PX surrounded by the plurality of gate scan signal lines LScan1 and the plurality of data signal lines LData. In the illustrated embodiment, the plurality of pixel regions PX on the array substrate 10 may include red (R) sub-pixels, green (G) sub-pixels, and blue (B) sub-pixels. A red (R) sub-pixel, a green (G) sub-pixel, and a blue (B) sub-pixel, which are adjacent to one another, may constitute a pixel unit. However, it is to be understood that such an arrangement is shown only as some exemplary embodiments, and in other embodiments, the plurality of pixel regions on the array substrate 10 may include red (R) sub-pixels, green (G) sub-pixels, blue (B) sub-pixels and white (W) sub-pixels, and a red (R) sub-pixel, a green (G) sub-pixel, a blue (B) sub-pixel, and a white (W) sub-pixel, which are adjacent to one another, may constitute a pixel unit.

As shown, for each sub-pixel, a pixel circuit 200 is provided to drive each sub-pixel. The pixel circuit 200 may include a switching transistor T1, a driving transistor T2, and a storage capacitor C1. The pixel circuit 200 may be operated as follows.

In a programming phase, one gate scan signal line LScan1 is gated, so that switching transistors T1 which are electrically connected to the one gate scan signal line LScan1 are turned on, and a signal voltage on the data signal line LData is written to a gate electrode of the driving transistor T2 through the switching transistor T1. During this phase, the switching transistor T1 operates in an active region, and the storage capacitor C1 is charged until a voltage between a source electrode and a drain electrode of the switching transistor T1 is zero. As a result, an electrical level of the gate electrode of the driving transistor T2 is equal to the signal voltage on the data signal line LData.

In a light-emitting phase, the gate scan signal line LScan1 is not gated, so that the switching transistors T1 are turned off, and the signal voltage stored in the storage capacitor C1 maintains the voltage of the gate electrode of the driving transistor T2, so that the driving transistor T2 is turned on. In this way, it ensures that there is a current flowing through the OLED during an entire frame, thereby driving the OLED to emit light.

In normal operation, the driving transistor T2 should be in a saturation region to provide a constant driving current during a period when one gate scan line is scanned. As shown in the following equation (1), the driving current may be expressed as:

$$I_{OLED} = \frac{1}{2} \mu_P \cdot Cox \cdot \frac{W}{L} \cdot (Vdata - ELVDD - V_{TH})^2, \quad (1)$$

wherein, $\mu_P$ is carrier mobility, Cox is a capacitance of gate oxide layer of a transistor, $$\frac{W}{L}$$

is a ratio of width to length of a channel of a transistor, Vdata is a data voltage, ELVDD is a driving voltage supplied to an OLED backplate, $V_{TH}$ is a threshold voltage of a transistor.

According to the above equation (1), in the first aspect, if threshold voltages $V_{TH}$ of transistors in different sub-pixels are different, for example, due to threshold voltage drift, there will be a difference between driving currents, resulting in non-uniform light luminance or chromaticity in different sub-pixels. In the second aspect, if carrier mobilities $\mu_P$ of the transistors in different sub-pixels are different, for example, due to manufacturing processes, or due to a temperature difference in different pixel regions, a difference in used frequency of TFTs in different pixel regions or a difference in illumination intensity on TFTs in different pixel regions in display operation, then non-uniform light luminance or chromaticity also be presented in different sub-pixels.

The inventors have found that when performing compensation, an internal compensation is mainly used to compensate for luminance or chromaticity non-uniformity caused by a difference in threshold voltage $V_{TH}$, and luminance or chromaticity non-uniformity caused by a difference in carrier mobility ftp is not compensated. Even if there are some methods for compensating for luminance or chromaticity non-uniformity caused by the difference in carrier mobility $\mu_P$, it is generally not compensated for luminance or chromaticity non-uniformity caused by both the difference in carrier mobility $\mu_P$ and the difference in carrier mobility $V_{TH}$. For example, when the luminance or chromaticity non-uniformity caused by the difference in carrier mobility $\mu_P$ is compensated, the threshold voltage $V_{TH}$ is considered to be constant, that is, the threshold voltages $V_{TH}$ of transistors in different sub-pixels are considered to be equal to one another. When the luminance or chromaticity non-uniformity caused by the difference in threshold voltage $V_{TH}$ is compensated, the carrier mobility $\mu_P$ is considered to be constant, that is, the carrier mobilities $\mu_P$ of transistors in different sub-pixels are considered to be equal to one another.

Moreover, the inventors have found through research that light-emitting device (for example, light-emitting layer, abbreviated as EL layer) of OLED display may not be uniform enough due to manufacturing processes, for example, when the EL layer is formed through an evaporation process, the EL layers in various sub-pixels may be non-uniform due to limitations of the evaporation process, resulting in non-uniform light luminance or chromaticity in different sub-pixels. Further, as usage time increases, the EL layer will be aged to different degrees, so that the EL layers in various sub-pixels may be non-uniform, resulting in non-uniform light luminance or chromaticity in different sub-pixels.

In order to at least solve one of the above technical problems, some embodiments of the present disclosure provide an OLED display panel, which is capable of detecting light emitted from a sub-pixel in real time and capable of performing a real-time compensation according to a detection result.

Hereinafter, the OLED display panel according to the embodiments of the present disclosure will be described in detail with reference to the accompanying drawings.

According to some exemplary embodiments of the present disclosure, the OLED display panel may be a bottom emission type OLED display panel. Referring to FIGS. 1-4, an array substrate 10 of an OLED display panel is shown. The array substrate 10 may include: a base substrate 11; a thin film transistor 12 disposed on the base substrate 11; a buffer layer 13 disposed on the base substrate 11; a light-detecting circuit 15 disposed on the buffer layer 13; a planarization layer 16 disposed both on the light-detecting circuit 15 and the thin film transistor 12; an OLED device 18 disposed on the planarization layer 16; an encapsulation layer 19 disposed on the OLED device 18; and a pixel defining layer 20 disposed on the planarization layer 16 and surrounding the OLED device 18.

Figure 2:
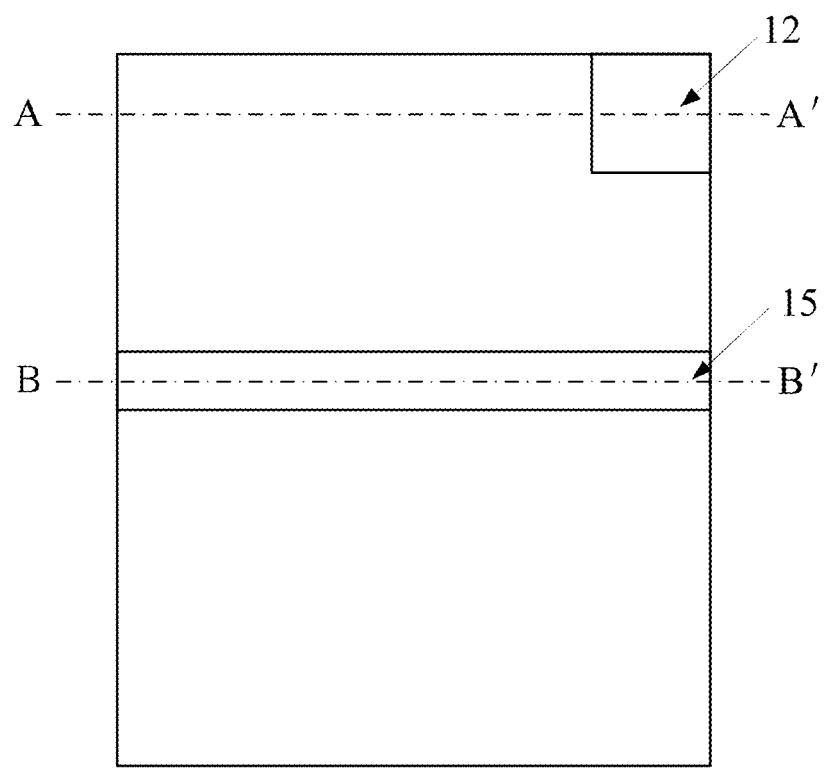
FIG. 2 is a plan view of one sub-pixel of an array substrate according to some exemplary embodiments of the present disclosure, in which a relative position between a thin film transistor and a photoresistor is schematically shown.
Figure 3:
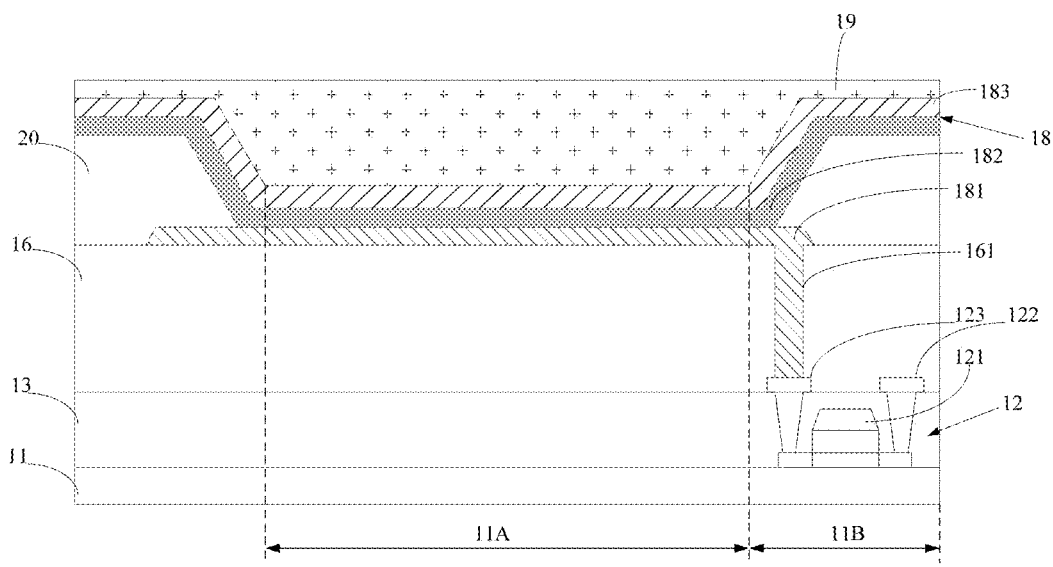
FIG. 3 is a cross-sectional view of a structure of the sub-pixel, taken along line A-A' in FIG. 2, according to some embodiments of the present disclosure.
Figure 4:
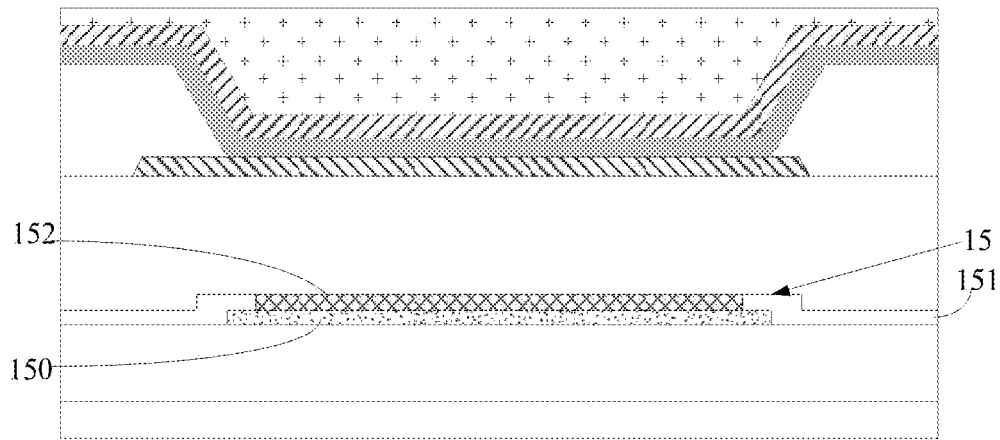
FIG. 4 is a cross-sectional view of a structure of the sub-pixel, taken along line B-B' in FIG. 2, according to some embodiments of the present disclosure.

As shown in FIG. 2, in the same one sub-pixel, an orthographic projection of the thin film transistor 12 on the base substrate 11 does not overlap with an orthographic projection of the light-detecting circuit 15 on the base substrate 11, so as to avoid a structural interference therebetween. As shown in FIG. 2, FIG. 3 and FIG. 4, a pixel region may include a light-emitting region 11A and a non-light-emitting region 11B, a pixel driving circuit including the thin film transistor 12 may be disposed in the non-light-emitting region 11B, and a photosensitive element of the light-detecting circuit 15 may be disposed in the light-emitting region 11A.

FIG. 3 is a cross-sectional view of a sub-pixel taken along line A-A' in FIG. 2, and FIG. 4 is a cross-sectional view of a sub-pixel taken along line B-B' in FIG. 2.

As shown in FIG. 3, the thin film transistor 12 may include a gate electrode 121, a source electrode 122, and a drain electrode 123. The OLED device 18 may include an anode 181, a luminescent material layer 182, and a cathode 183. The luminescent material layer 182 is located between the anode 181 and the cathode 183. In the bottom emission type OLED display panel shown in FIG. 2, the anode 181 may be a transparent conductive electrode such as an ITO electrode, and the cathode 183 may be an opaque conductive electrode such as a metal cathode. As shown, the anode 181 may be electrically connected to the drain electrode 123 of the thin film transistor 12 through a via hole 161 in the planarization layer 16. Alternatively, the anode 181 may be electrically connected to the source electrode 122 of the thin film transistor 12 through the via hole 161 in the planarization layer 16.

According to some exemplary embodiments of the present disclosure, as shown in FIG. 4, the light-detecting circuit 15 may include: a photoresistor 150; and a photoresistor connecting wire 151 for electrically connecting the photoresistor 150 to a photoresistor driving circuit (which will be described in detail below). As shown in FIG. 4, the photoresistor 150 may be located in the same layer as the photoresistor connecting wire 151. An orthographic projection of the photoresistor 150 on the base substrate 11 overlaps with an orthographic projection of the luminescent material layer 182 on the base substrate 11.

The photoresistor includes a semiconductor material that exhibits different resistivities at different light intensities. Moreover, there are many types of photoresistor materials, and different types of photoresistor materials respond to different spectral ranges. Specifically, different photoresistor materials have different spectral characteristics, that is, sensitivities of the photoresistors are varied depending on light of different wavelengths. For example, cadmium sulfide (CdS) is sensitive to blue light, cadmium selenide sulfide (Cd(S, Se)) is sensitive to green light, and cadmium selenide (CdSe) is sensitive to red light.

In particular, light has wave-particle duality, that is, the light has all the properties of a wave. According to wavelength of light waves, light may be divided into, from short wavelength to long wavelength, X-ray, ultraviolet light, blue light, green light, red light, and the like. Among them, the blue light, the green light and the red light are called as light of three primary colors. In physical meaning, the blue light, the green light and the red light may be mixed to form visible light of any color. Therefore, it can be considered that any kind of visible light is a weighted value obtained by multiplying blue light, green light, and red light by respective weight coefficients. For example, wavelengths of blue light, green light, and red light may be respectively recorded as $\lambda_B$ (e.g., 450 nm), $\lambda_G$ (e.g., 540 nm), $\lambda_R$ (e.g., 600 nm), and then visible light L of any color can be expressed by the following equation (2):

$$L = M \cdot \lambda_B + N \cdot \lambda_R + P \cdot \lambda_G \qquad (2),$$

wherein, M, N and P represent the weight coefficients of blue light, green light, and red light, respectively.

A resistance value of a photoresistor when it is not irradiated with light is called a dark-state resistance value. In some embodiments of the present disclosure, the dark-state resistance value of the photoresistor 150 may be denoted as R0. When the photoresistor 150 is irradiated with light of a certain wavelength and intensity, its resistance value changes, and the changed resistance value may be recorded as RL, and a change (i.e., RL-R0) in resistance value may be recorded as ΔR.

When the photosensitive resistor 150 is irradiated with visible light, the change in resistance value of the photoresistor 150 may be expressed by the following equation (3):

$$\Delta R = a \cdot M + b \cdot N + c \cdot P \qquad (3),$$

wherein, a, b and c respectively represent light sensitivity coefficients of photoresistor material of the photoresistor 150 to blue light, green light and red light of the visible light. As for a certain photoresistor material, the light sensitivity coefficients to the visible light is constant, that is, a, b and c are constant values for a certain photoresistor material.

In one example, as shown in FIG. 1, the light-detecting circuit 15 may include a first light-detecting circuit 15B disposed in a blue sub-pixel, a second light-detecting circuit 15G disposed in a green sub-pixel, and a third light-detecting circuit 15R disposed in a red sub-pixel. It is to be understood that one light-detecting circuit may be provided in one pixel unit.

Hereinafter, an operation process of the light-detecting circuit will be described in detail by taking the first light-detecting circuit 15B disposed in the blue sub-pixel as an example.

The first light-detecting circuit 15B may include a first photoresistor 150B made of a first photoresistor material, and the light sensitivity coefficients a, b and c of the first photoresistor material to the visible light are respectively $a_1$, $b_1$, and $c_1$. For example, the first photoresistor material may be CdS that is sensitive to blue light.

Figure 5A:
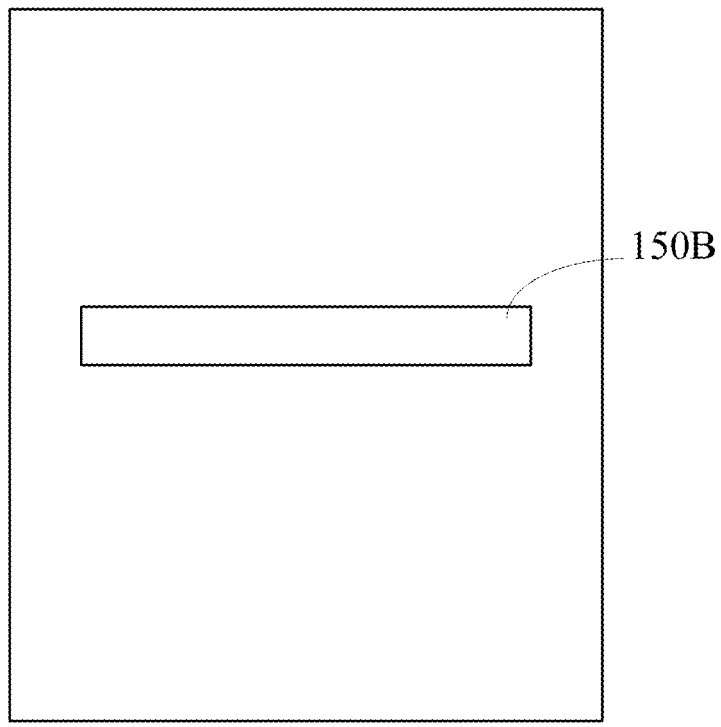
FIG. 5A to FIG. 5C are plan views of a sub-pixel, in which positions where a photoresistor is disposed are schematically shown.
Figure 5B:
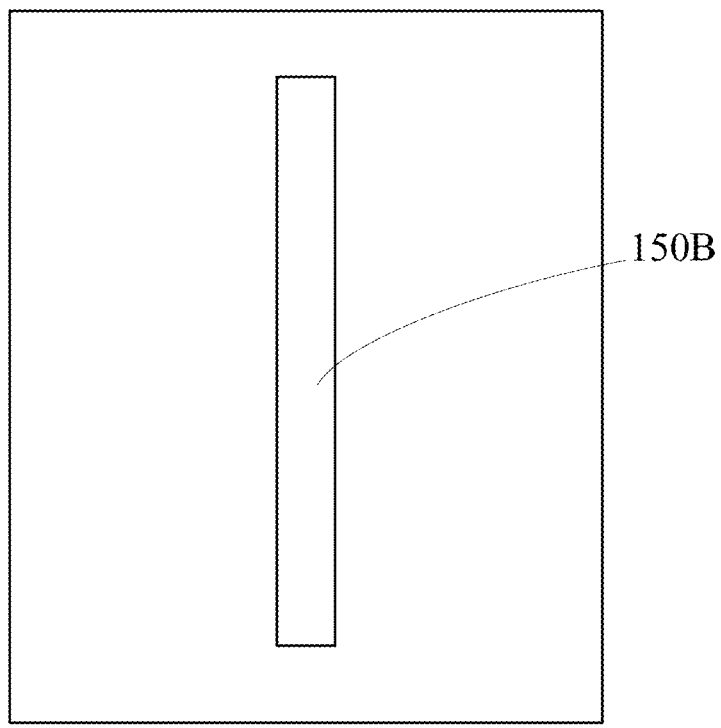
Figure 5C:
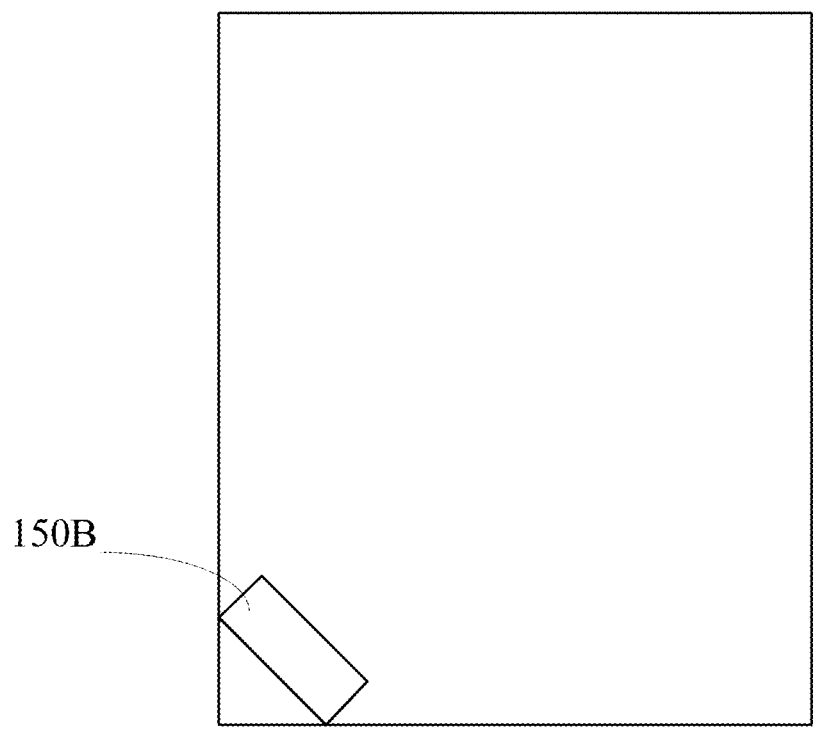

The first photoresistor 150B may be disposed in a light-emitting region of the blue sub-pixel to receive light emitted from the blue sub-pixel. For example, as shown in FIG. 5A, the first photoresistor 150B may be disposed at a central position of the blue sub-pixel in its longitudinal direction. Alternatively, as shown in FIG. 5B, the first photoresistor 150B may be disposed at a central position of the blue sub-pixel in its lateral direction. Alternatively, as shown in FIG. 5C, the first photoresistor 150B may be disposed at an edge position of the light-emitting region of the blue sub-pixel. In some embodiments of the present disclosure, the photoresistor may be disposed at any position of the light-emitting region of the sub-pixel as long as it may receive the light emitted from the corresponding sub-pixel.

As the light emitted from the blue sub-pixel is blue light, N and P in the above equation (2) which represent intensities of the green light and the red light respectively should be equal to zero, that is, for the blue light $L_B$, the above equation (2) may be expressed as:

$$L_B = M \cdot \lambda_B \quad (4).$$

Specifically, the weight coefficient of the blue light emitted from a blue sub-pixel has its design value which may be recorded as $M_0$, then a designed blue light may be expressed as: $L_{B0} = M_0 \cdot \lambda_B$.

The blue light actually emitted from the blue sub-pixel may be detected by the light-detecting circuit. Specifically, for the first photoresistor 150B, the equation (3) may be expressed as:

$$\Delta R_1 = a_1 \cdot M_1 \quad (5).$$

When the first photoresistor 150B is irradiated with blue light emitted from the blue sub-pixel, the resistance value thereof changes, and the changed resistance value RL1 may be measured (the specific measurement process will be described in detail below), and the dark-state resistance value R0 of the first photoresistor 150B is a known value, so that the change $\Delta R_1$ in resistance value of the first photoresistor 150B may be obtained by calculating RL1-R0. Thus, in the above equation (5), $\Delta R_1$ and $a_1$ are known values so that the weight coefficient $M_1$ of the blue light actually emitted from the blue sub-pixel may be calculated, thereby detecting the blue light actually emitted from the blue sub-pixel.

According to some embodiments of the present disclosure, the weight coefficient $M_1$ of the blue light actually emitted from the blue sub-pixel may be further compared with the design value $M_0$ of the weight coefficient. For example, if it is determined that $M_1 > M_0$ through the comparison, an intensity of the blue light emitted from the blue sub-pixel may be reduced when the next frame is displayed, and if it is determined that $M_1 < M_0$ through the comparison, an intensity of the blue light emitted from the blue sub-pixel may be increased when the next frame is displayed. In this way, the light emitted from the blue sub-pixel may be compensated so that the light emitted from the blue sub-pixel satisfies design requirements, thereby achieving uniform luminance of the entire display panel.

Figure 6:
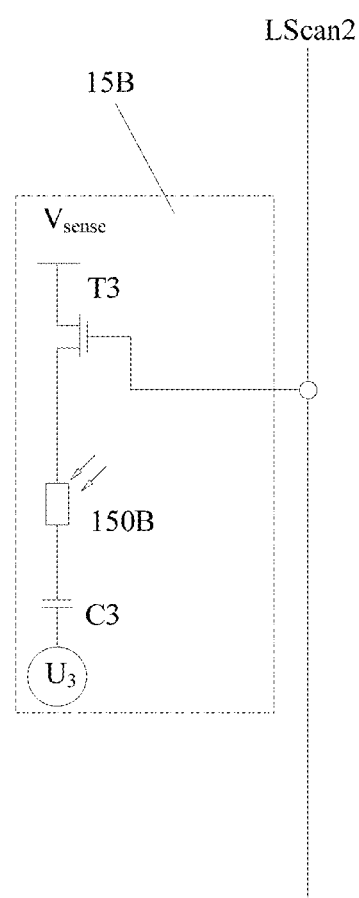
FIG. 6 is a schematic diagram of a light-detecting circuit according to some embodiments of the present disclosure.

FIG. 6 shows a schematic diagram of a light-detecting circuit according to some exemplary embodiments of the present disclosure. As shown in FIG. 1 and FIG. 6, the first light-detecting circuit 15B may include: a first photoresistor 150B; and an auxiliary circuit coupled to the first photoresistor 150B. The auxiliary circuit may include: a first transistor T3, and a first capacitor C3. A gate electrode of the first transistor T3 is electrically connected to a first gate scan line LScan2, a source electrode of the first transistor T3 is electrically connected to a signal line for supplying a driving voltage $V_{sense}$, and a drain electrode of the first transistor T3 is electrically connected to one end of the first photoresistor 150B. The other end of the first photoresistor 150B is electrically connected to one end of the first capacitor C3. It is to be understood that the source electrode and the drain electrode of the first transistor T3 may be interchanged. For example, the drain electrode of the first transistor T3 is electrically connected to the signal line for supplying the driving voltage $V_{sense}$, and the source electrode of the first transistor T3 is electrically connected to one end of the first photoresistor 150B.

When the first gate scan line LScan2 is gated, the first transistor T3 is turned on, so that a signal voltage $V_{sense}$ on the signal line is applied to the first photoresistor 150B through the first transistor T3. When the display panel is displaying, a voltage on the first capacitor C3 may be detected after a detection period t. First, a current flowing through the first photoresistor 150B may be calculated by using the following equation:

$$Q_3 = I_3 \cdot t$$

$$Q_3 = C_3 \cdot U_3 \quad (6),$$

wherein, $Q_3$ is an electric quantity, $C_3$ is a capacitance of the first capacitor and is a design value, t is a period for one charging detection (for example, the period of a high electric level on the first gate scan line LScan2) and is also a design value, $U_3$ is a voltage detected on the first capacitor C3. In particular, $C_3$ and t are known design values.

According to the above equation (6), the current flowing through the first photoresistor 150B may be calculated.

Further, a resistance value of the first photoresistor 150B at this time, that is, the resistance value RL1 of the first photoresistor 150B after being irradiated with the light emitted from the blue sub-pixel, may be calculated by using the following equation (7):

$$RL1 = \frac{V_{sense} - U_3}{I_3}, \quad (7)$$

wherein, RL1 is the resistance value of the first photoresistor 150B after being irradiated with light emitted from the blue sub-pixel, $V_{sense}$ is the signal voltage on the signal line, $U_3$ is the voltage detected on the first capacitor C3, and $I_3$ is the current flowing through the first photoresistor 150B.

In some embodiments of the present disclosure, the resistance value of the photoresistor may be detected in real time, and the intensity of the light may be determined according to a mapping relationship between the resistance value of the photoresistor and the intensity of the light that illuminates the photoresistor. In other words, the light which is actually emitted from the sub-pixel in which the photoresistor is provided may be detected in real time. Further, the light emitted from the sub-pixel may be compensated in real time according to the light detected in real time, thereby improving the luminance uniformity of the display panel. In the entire process, the compensation is performed according to the detected light actually emitted from the sub-pixel in which the photoresistor is provided. In this way, not only the luminance or chromaticity non-uniformity in different sub-pixels due to the threshold voltage drift may be compensated, but also the luminance or chromaticity non-uniformity in different sub-pixels due to the difference in carrier mobility may be compensated, further the luminance or chromaticity non-uniformity in different sub-pixels due to unstable manufacturing processes and/or EL layer aging may also be compensated.

Similarly, light-detecting circuits may also be provided in the green sub-pixel and/or the red sub-pixel so as to detect light actually emitted from the green sub-pixel and/or from the red sub-pixel. Further, the light actually emitted from the green sub-pixel and/or from the red sub-pixel may be compensated according to the detections.

For example, referring to FIG. 1, the second light-detecting circuit 15G may include: a second photoresistor 150G; and an auxiliary circuit coupled to the second photoresistor 150G. The auxiliary circuit may include: a second transistor T4, and a second capacitor C4. A gate electrode of the second transistor T4 is electrically connected to a first gate scan line LScan2, a source electrode of the second transistor T4 is electrically connected to a signal line for supplying a driving voltage $V_{sense}$, and a drain electrode of the second transistor T4 is electrically connected to one end of the second photoresistor 150G. The other end of the second photoresistor 150B is electrically connected to one end of the second capacitor C4. It is to be understood that the source electrode and the drain electrode of the second transistor T4 may be interchanged. For example, the drain electrode of the second transistor T4 is electrically connected to the signal line for supplying the driving voltage $V_{sense}$, and the source electrode of the second transistor T4 is electrically connected to one end of the second photoresistor 150G.

The second photoresistor 150G may be made of a second photoresistor material, and the light sensitivity coefficients a, b and c of the second photoresistor material to the visible light are respectively $a_2$, $b_2$ and $c_2$. For example, the second photoresistor material may be Cd(S, Se) that is sensitive to green light. The second photoresistor 150G may be disposed in a light-emitting region of the green sub-pixel to receive light emitted from the green sub-pixel.

For example, the second photoresistor 150G may be disposed at a central position of the green sub-pixel in its longitudinal direction. Alternatively, the second photoresistor 150G may be disposed at a central position of the green sub-pixel in its lateral direction. Alternatively, the second photoresistor 150G may be disposed at an edge position of the light-emitting region of the green sub-pixel.

For example, referring to FIG. 1, the third light-detecting circuit 15R may include: a third photoresistor 150R; and an auxiliary circuit coupled to the third photoresistor 150R. The auxiliary circuit may include: a third transistor T5, and a third capacitor C5. A gate electrode of the third transistor T5 is electrically connected to a first gate scan line LScan2, a source electrode of the third transistor T5 is electrically connected to a signal line for supplying a driving voltage $V_{sense}$, and a drain electrode of the third transistor T5 is electrically connected to one end of the third photoresistor 150R. The other end of the third photoresistor 150R is electrically connected to one end of the third capacitor C5.

It is to be understood that the source electrode and the drain electrode of the third transistor T5 may be interchanged. For example, the drain electrode of the third transistor T5 is electrically connected to the signal line for supplying the driving voltage $V_{sense}$, and the source electrode of the third transistor T5 is electrically connected to one end of the third photoresistor 150R.

The third photoresistor 150R may be made of a third photoresistor material, and the light sensitivity coefficients a, b and c of the third photoresistor material to the visible light are respectively $a_3$, $b_3$ and $c_3$. For example, the third photoresistor material may be CdSe that is sensitive to red light. The third photoresistor 150R may be disposed in a light-emitting region of the red sub-pixel to receive light emitted from the red sub-pixel.

For example, the third photoresistor 150R may be disposed at a central position of the red sub-pixel in its longitudinal direction. Alternatively, the third photoresistor 150R may be disposed at a central position of the red sub-pixel in its lateral direction. Alternatively, the third photoresistor 150R may be disposed at an edge position of the light-emitting region of the red sub-pixel.

The operation processes of both the second light-detecting circuit and the third light-detecting circuit are similar to those of the first light-detecting circuit, and are not repeated here again.

Figure 7:
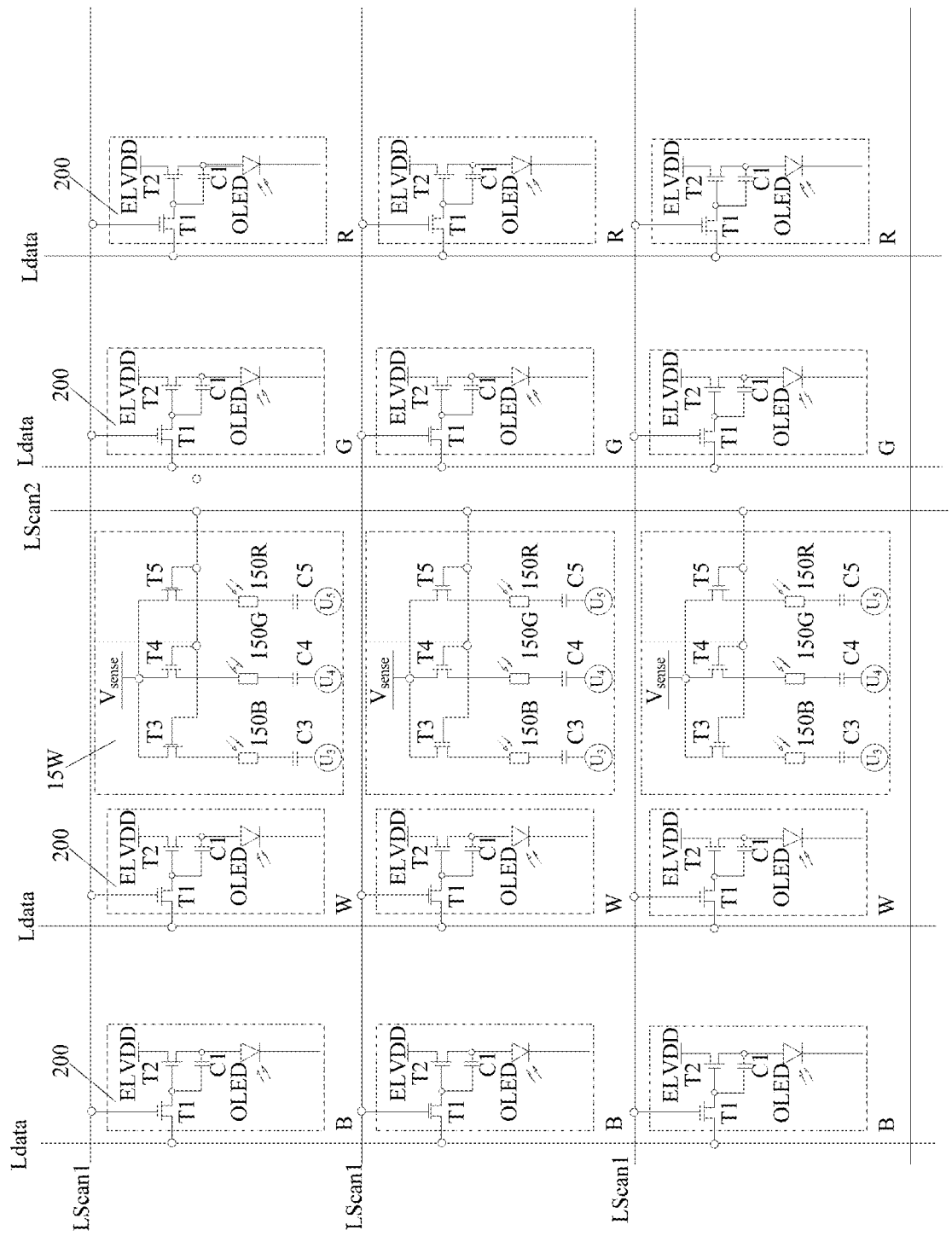
FIG. 7 is a schematic view of an array substrate according to some other exemplary embodiments of the present disclosure, in which a pixel arrangement is shown.
Figure 8:
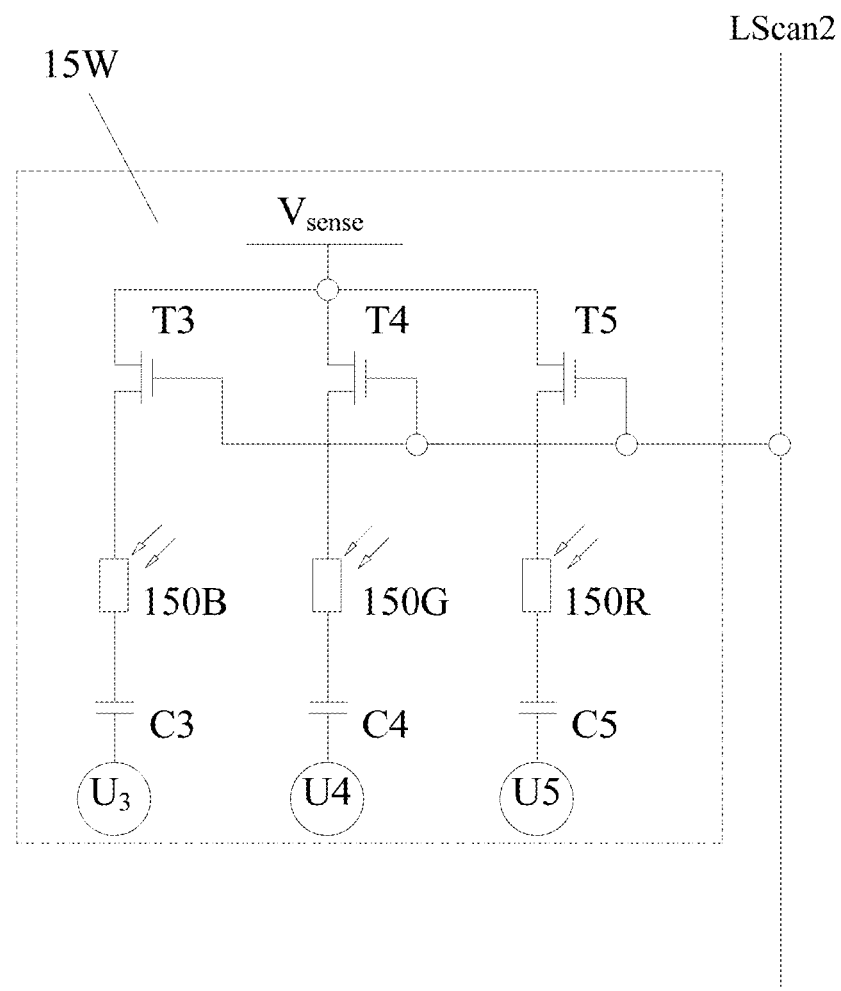
FIG. 8 is a schematic diagram of a light-detecting circuit according to some other embodiments of the present disclosure.

According to some exemplary embodiments of the present disclosure, the light-detecting circuit may be disposed in a white sub-pixel. Specifically, as shown in FIG. 7 and FIG. 8, a fourth light-detecting circuit 15W is disposed in the white sub-pixel, and it may include: a first photoresistor 150B, a second photoresistor 150G, and a third photoresistor 150R; and an auxiliary circuit. The auxiliary circuit may include: a first transistor T3, a second transistor T4, and a third transistor T5; and a first capacitor C3, a second capacitor C4, and a third capacitor C5. A gate electrode of the first transistor T3, a gate electrode of the second transistor T4, and a gate electrode of the third transistor T5 are all electrically connected to the first gate scan line LScan2. A source electrode of the first transistor T3, a source electrode of the second transistor T4, and a source electrode of the third transistor T5 are all electrically connected to a driving voltage terminal $V_{sense}$. A drain electrode of the first transistor T3 is electrically connected to one end of the first photoresistor 150B, and the other end of the first photoresistor 150B is electrically connected to one end of the first capacitor C3. A drain electrode of the second transistor T4 is electrically connected to one end of the second photoresistor 150G, and the other end of the second photoresistor 150G is electrically connected to one end of the second capacitor C4. A drain electrode of the third transistor T5 is electrically connected to one end of the third photoresistor 150R, and the other end of the third photoresistor 150R is electrically connected to one end of the third capacitor C5.

When the first gate scan line LScan2 is gated, the first transistors T3, the second transistors T4, and the third transistors T5 in the same one column are all turned on, and a driving voltage $V_{sense}$ is applied to the first photoresistor 150B, the second photoresistor 150G, and the third photoresistor 150R respectively through the first transistor T3, the second transistor T4, and the third The transistor T5. When the display panel is displaying, a voltage on the first capacitor C3, a voltage on the second capacitor C4, and a voltage on the third capacitor C5 may be respectively detected after a detection period t. First, a current $I_B$ flowing through the first photoresistor 150B, a current $I_G$ flowing through the second photoresistor 150G, and a current $I_R$ flowing through the third photoresistor 150R may be respectively calculated by using the above equation (6). Then, by using the above equation (7), a resistance value $RL_B$ of the first photoresistor 150B after being irradiated with light from the white sub-pixel, a resistance value $RL_G$ of the second photoresistor 150G after being irradiated with light from the white sub-pixel, and a resistance value $RL_R$ of the third photoresistor 150R after being irradiated with light from the white sub-pixel are respectively calculated. It is known that dark-state resistance values of the first photoresistor 150B, the second photoresistor 150G, and the third photoresistor 150R are respectively $R0_B$, $R0_G$ and $R0_R$. A change $\Delta R_B$ in resistance value of the first photoresistor 150B, a change $\Delta R_G$ in resistance value of the second photoresistor 150G, and a change $\Delta R_R$ in resistance value of the third photoresistor 150R may be respectively calculated by the following equation (8):

$$\Delta R_B = RL_B - R0_B$$

$$\Delta R_G = RL_G - R0_G$$

$$\Delta R_R = RL_R - R0_R \qquad (8).$$

According to the above equation (2), light emitted from the white sub-pixel may be expressed as follows:

$$L_W = M \cdot \lambda_B + N \cdot \lambda_G + P \cdot \lambda_R,$$

wherein, $\lambda_B$, $\lambda_G$ and $\lambda_R$ are wavelengths of blue light, green light, and red light, respectively, for example, they may be equal to 450 nm, 540 nm, and 600 nm, respectively, and M, N and P represent weight coefficients of blue light, green light, and red light, respectively.

When the light emitted from one white sub-pixel simultaneously illuminates the first photoresistor 150B, the second photoresistor 150G, and the third photoresistor 150R, the change $\Delta R_B$ in resistance value of the first photoresistor 150B, the change $\Delta R_G$ in resistance value of the second photoresistor 150G, and the change $\Delta R_R$ in resistance value of the third photoresistor 150R may be respectively expressed by the following equation (9):

$$\Delta R_B = a_1 \cdot M + b_1 \cdot N + c_1 \cdot P$$

$$\Delta R_G = a_2 \cdot M + b_2 \cdot N + c_2 \cdot P$$

$$\Delta R_R = a_3 \cdot M + b_3 \cdot N + c_3 \cdot P \qquad (9),$$

wherein, $a_1$, $b_1$ and $c_1$ respectively represent light sensitivity coefficients of photoresistor material of the first photoresistor 150B to blue light, green light and red light of light emitted from the white sub-pixel; $a_2$, $b_2$ and $c_2$ respectively represent light sensitivity coefficients of photoresistor material of the second photoresistor 150G to blue light, green light and red light of the light emitted from the white sub-pixel; $a_3$, $b_3$ and $c_3$ respectively represent light sensitivity coefficients of photoresistor material of the third photoresistor 150R to blue light, green light and red light of the light emitted from the white sub-pixel.

It is to be understood that when the photoresistor material is known, its light sensitivity coefficients to blue light, green light and red light are also known constants. That is to say, in the above equation (9), the light sensitivity coefficients $a_1$, $b_1$, $c_1$, $a_2$, $b_2$, $c_2$, $a_3$, $b_3$ and $c_3$ are all known constants.

Those skilled in the art will appreciate that when photoresistors which are respectively made of three photoresistor materials are irradiated with the same one light beam, the changes in resistance value of the photoresistors are different. That is, the change $\Delta R_B$ in resistance value of the first photoresistor 150B, the change $\Delta R_G$ in resistance value of the second photoresistor 150G, and the change $\Delta R_R$ in resistance value of the third photoresistor 150R calculated by the above equation (8) are different. Thus, values at the left side of the above equation (9) can be determined through detection and are different from one another. The above equation (9) constitutes a three-variable linear equation system. By solving the three-variable linear equation system, three variables M, N and P may be calculated, that is, weight coefficients M, N and P of blue light, green light and red light in the light actually emitted from the white sub-pixel may be calculated.

As for the light emitted from the white sub-pixel, there are designed weight coefficients $M_0$, $N_0$ and $P_0$ of blue light, green light and red light.

The weight coefficients M, N and P of blue light, green light and red light in the light actually emitted from the white sub-pixel are respectively compared with the designed weight coefficients $M_0$, $N_0$ and $P_0$ of blue light, green light and red light, so as to determine a deviation of the blue light, a deviation of the green light and a deviation of the red light in the light actually emitted from the white sub-pixel. Thereafter, a compensation may be accordingly performed for these deviations. For example, if the weight coefficients M, N and P of blue light, green light and red light in the light actually emitted from the white sub-pixel are respectively equal to 1, 0.4, 0.6 through the calculation, and the designed weight coefficients $M_0$, $N_0$ and $P_0$ of blue light, green light and red light in the light emitted from the white sub-pixel are respectively equal to 1, 0.5, 0.5, then, in following frame display, light actually emitted from the white sub-pixel needs to be adjusted, for example, to increase an intensity of the green light and reduce an intensity of the red light, so that the light actually emitted from the white sub-pixel reaches a design value, thereby improving display uniformity.

Figure 9A:
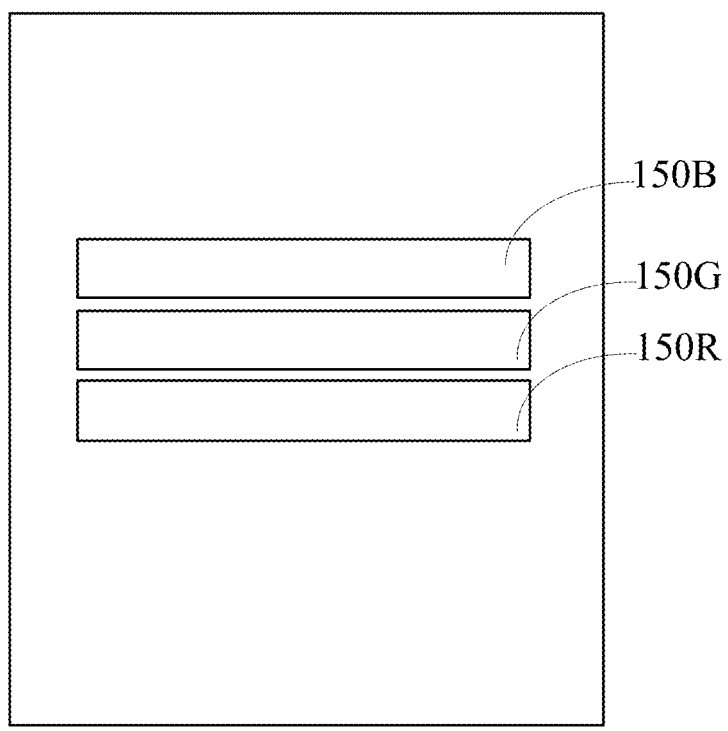
FIG. 9A to FIG. 9D are plan views of a sub-pixel, in which positions where photoresistors are disposed are schematically shown.
Figure 9B:
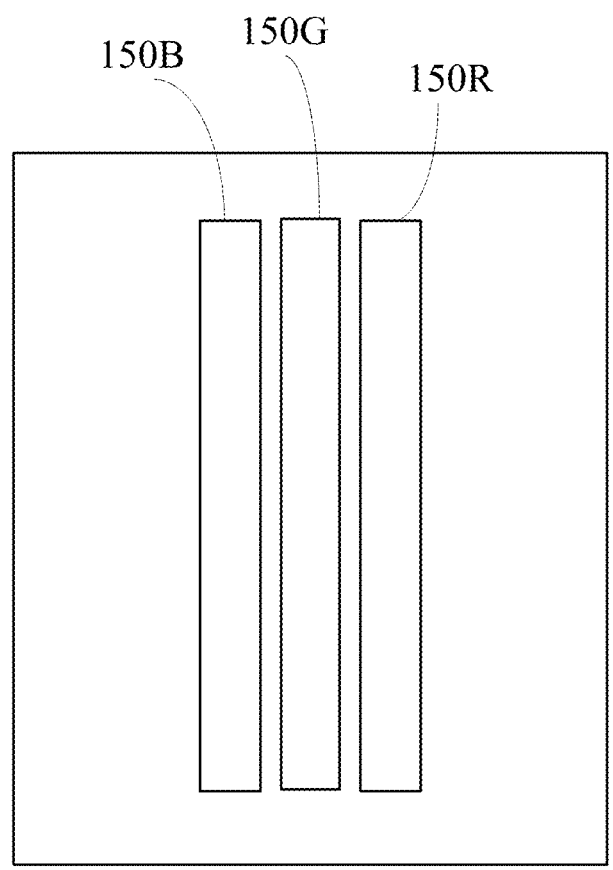
Figure 9C:
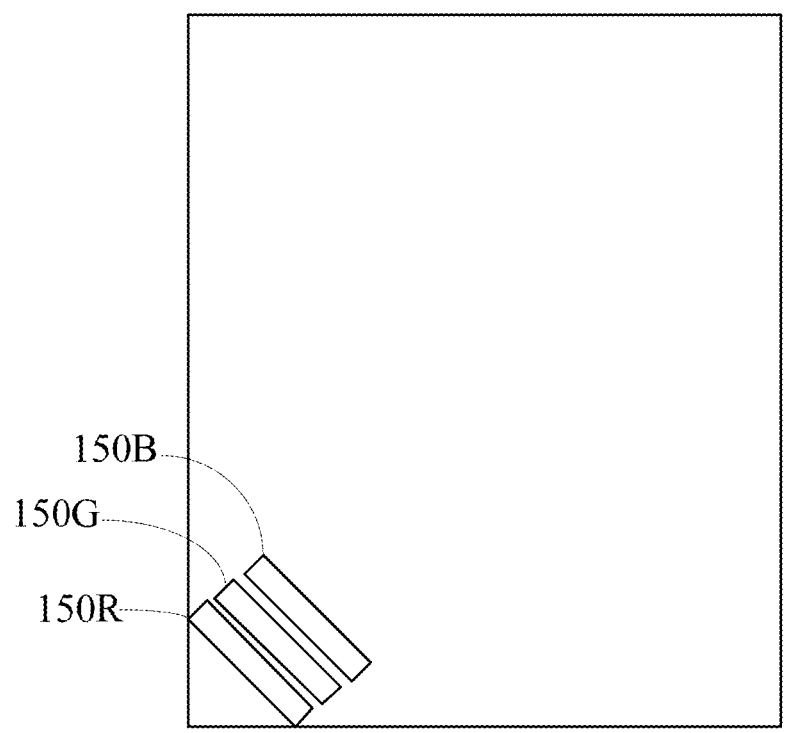

The first photoresistor 150B, the second photoresistor 150G, and the third photoresistor 150R of the fourth light-detecting circuit 15W may be disposed in a light-emitting region of the white sub-pixel to receive light emitted from the white sub-pixel. In some embodiments of the present disclosure, the first photoresistor 150B, the second photoresistor 150G, and the third photoresistor 150R may be disposed at any position of the light-emitting region of the white sub-pixel as long as they can receive the light emitted from the white sub-pixel. For example, the first photoresistor 150B, the second photoresistor 150G, and the third photoresistor 150R in the same one white sub-pixel may be disposed at substantially the same position in the white sub-pixel. For example, as shown in FIG. 9A, the first photoresistor 150B, the second photoresistor 150G, and the third photoresistor 150R may each be disposed at a central position of the white sub-pixel in its longitudinal direction. Alternatively, as shown in FIG. 9B, the first photoresistor 150B, the second photoresistor 150G, and the third photoresistor 150R may each be disposed at a central position of the white sub-pixel in its lateral direction. Alternatively, as shown in FIG. 9C, the first photoresistor 150B, the second photoresistor 150G, and the third photoresistor 150R may each be disposed at an edge position of the light-emitting region of the white sub-pixel.

Figure 9D:
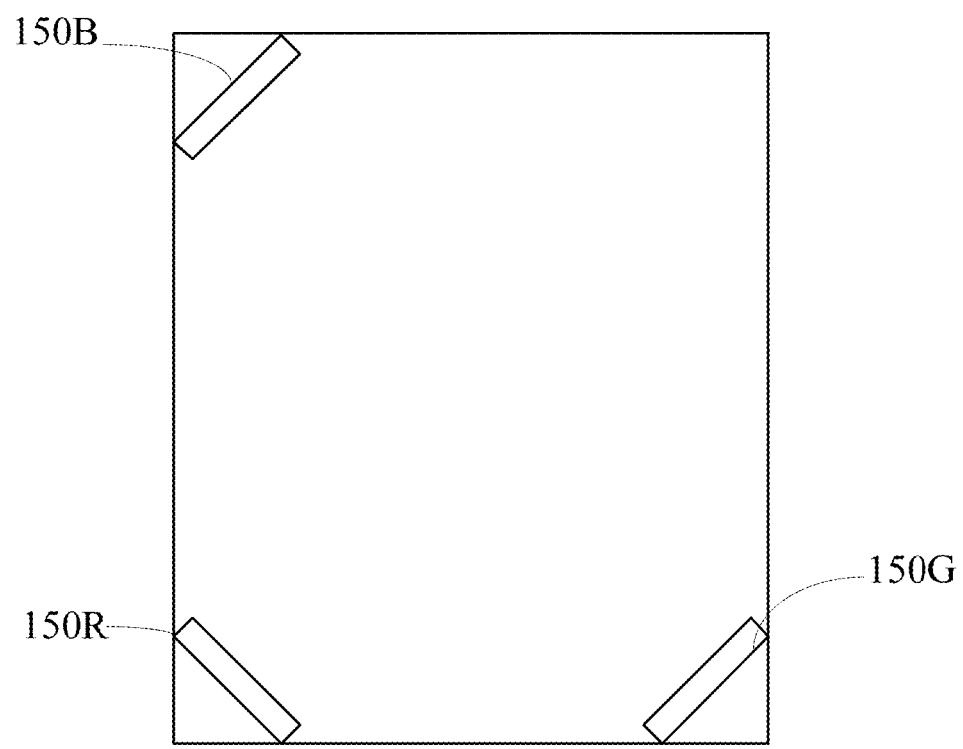

Alternatively, the first photoresistor 150B, the second photoresistor 150G, and the third photoresistor 150R in the same one white sub-pixel may be disposed at different positions in the white sub-pixel. For example, the first photoresistor 150B may be disposed at a central position of the white sub-pixel in its longitudinal direction, the second photoresistor 150G may be disposed at a central position of the white sub-pixel in its lateral direction, and the third photoresistor 150R may be disposed at an edge position of the light-emitting region of the white sub-pixel. Alternatively, as shown in FIG. 9D, the first photoresistor 150B may be disposed at a first edge position of the light-emitting region of the white sub-pixel, and the second photoresistor 150G may be disposed at a second edge position of the light-emitting region of the white sub-pixel, and the third photoresistor 150R may be disposed at a third edge position of the light-emitting region of the white sub-pixel.

In the display panel, white light emitted from the white sub-pixels is prone to non-uniform chromaticity. In the embodiments of the present disclosure, the white light emitted from the white sub-pixel may be detected in real time, and the compensation may be performed in real time, thereby effectively improving the luminance uniformity of the display panel. Throughout the process, the compensation is performed according to the detection on the light actually emitted from the white sub-pixel provided with the photoresistors, not only the luminance or chromaticity non-uniformity in different sub-pixels due to the threshold voltage drift may be compensated, but also the luminance or chromaticity non-uniformity in different sub-pixels due to the difference in carrier mobility may be compensated, further the luminance or chromaticity non-uniformity in different sub-pixels due to unstable manufacturing processes and/or EL layer aging may also be compensated.

According to some embodiments of the present disclosure, the light-detecting circuit described above may be disposed in at least one sub-pixel. For example, the above light-detecting circuit may only include the first light-detecting circuit disposed in the blue sub-pixel, or may only include the second light-detecting circuit disposed in the green sub-pixel, or may only include the third light-detecting circuit disposed in the red sub-pixel, or may only include the fourth light-detecting circuit disposed in the white sub-pixel. For another example, the light-detecting circuit may include at least two of the first light-detecting circuit disposed in the blue sub-pixel, the second light-detecting circuit disposed in the green sub-pixel, the third light-detecting circuit disposed in the red sub-pixel, or the fourth light-detecting circuit disposed in the white sub-pixel. For another example, the light-detecting circuit may include at least three of the first light-detecting circuit disposed in the blue sub-pixel, the second light-detecting circuit disposed in the green sub-pixel, the third light-detecting circuit disposed in the red sub-pixel, or the fourth light-detecting circuit disposed in the white sub-pixel. For another example, the light-detecting circuit may include all of the first light-detecting circuit disposed in the blue sub-pixel, the second light-detecting circuit disposed in the green sub-pixel, the third light-detecting circuit disposed in the red sub-pixel, and the fourth light-detecting circuit disposed in the white sub-pixel.

In the above embodiments, the photoresistor is used as the photosensitive element of the light-detecting circuit to detect light emitted from the pixel region in which the photosensitive element is disposed. In other embodiments of the present disclosure, the photosensitive element may further include a photodiode, a phototransistor or a solar cell.

For example, referring to FIG. 6, the photoresistor 150B may be replaced with a photodiode. In this case, the light-detecting circuit may include: a first transistor T3; a photodiode; and a first capacitor C3. A gate electrode of the first transistor T3 is electrically connected to the first gate scan line LScan2, a source electrode of the first transistor T3 is electrically connected to a signal line for supplying the driving voltage $V_{sense}$, and a drain electrode of the first transistor T3 is electrically connected to one end of the photodiode. The other end of the photodiode is electrically connected to one end of the first capacitor C3.

For example, the photosensitive element may be a solar cell, such as a thin film solar cell, for converting a received optical signal into a voltage signal. In this case, an auxiliary circuit may be designed to measure a voltage across the solar cell so as to convert the optical signal received by the solar cell into the voltage signal.

Referring back to FIG. 4, the array substrate 10 may further include: a light absorbing layer 152 disposed on the photoresistor 150. The light absorbing layer 152 is disposed in an optical path of the light emitted from the sub-pixels towards the photoresistor 150 so as to absorb a portion of the light that is irradiated onto the photoresistor 150. In this way, even if an intensity of the light emitted from the sub-pixel is very large, it is still ensured that an intensity of the light received by the photoresistor is within its detection range. That is, by providing the light absorbing layer, it is possible to avoid an occurrence of exceeding the detection range of the photoresistor.

In the embodiments shown in FIGS. 3 and 4, the array substrate 10 is a bottom emission type OLED array substrate. The light emitted from the luminescent material layer 182 is emitted toward the base substrate 11, and the photoresistor is disposed in the optical path of the light emitted from the luminescent material layer 182. As shown, the photoresistor 150 is disposed between the base substrate 11 and the luminescent material layer 182.

Figure 10:
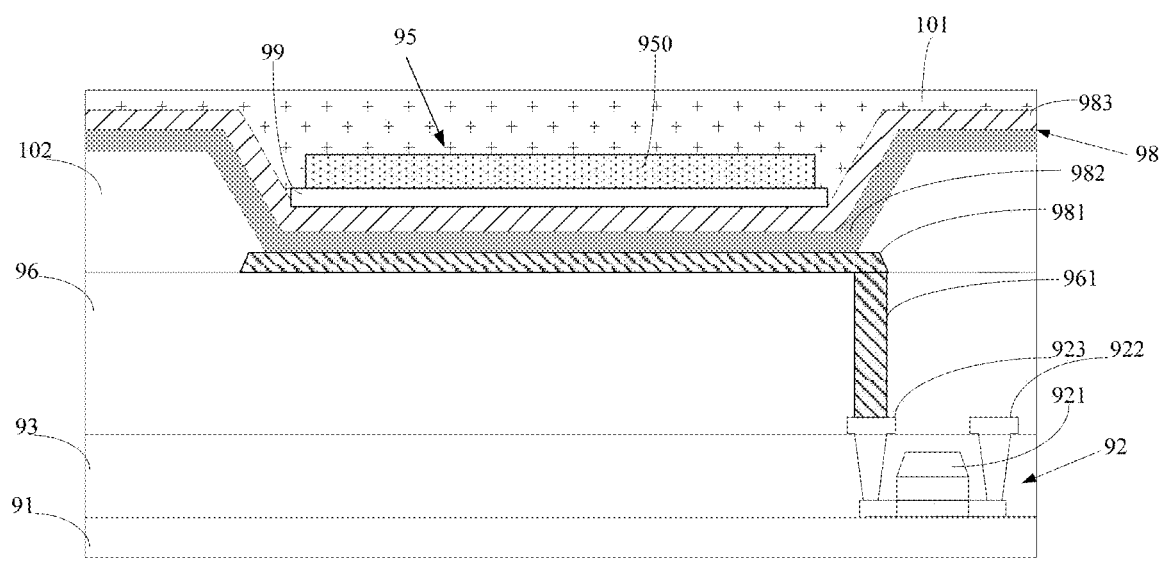
FIG. 10 is a cross-sectional view of a top emission type OLED array substrate according to some embodiments of the present disclosure.

FIG. 10 illustrates a structural view of a pixel of an array substrate according to other exemplary embodiments of the present disclosure. The array substrate is a top emission type OLED array substrate. As shown in FIG. 10, the array substrate 90 may include: a base substrate 91; a thin film transistor 92 disposed on the base substrate 91; a buffer layer 93 disposed on the base substrate 91; a planarization layer 96 disposed on the thin film transistor 92; an OLED device 98 disposed on the planarization layer 96; an insulating layer 99 disposed on the OLED device 98; a light-detecting circuit 95 disposed on the insulating layer 99; an encapsulation layer 101 disposed on the light-detecting circuit 95 and the OLED device 98; and a pixel defining layer 102 disposed on the planarization layer 96 and surrounding the OLED device 98.

For example, as shown in FIG. 10, the thin film transistor 92 may include a gate electrode 921, a source electrode 922, and a drain electrode 923. The OLED device 98 may include an anode 981, a luminescent material layer 982, and a cathode 983. The luminescent material layer 982 is located between the anode 981 and the cathode 983. In the top emission type OLED display panel shown in FIG. 10, the anode 981 may be an opaque conductive electrode such as a metal anode, and the cathode 983 may be a transparent conductive electrode such as an ITO electrode. As shown, the anode 981 may be electrically connected to the drain electrode 923 of the thin film transistor 92 through a via hole 961 in the planarization layer 96. Alternatively, the anode 981 may be electrically connected to the source electrode 922 of the thin film transistor 92 through a via hole 961 in the planarization layer 96.

In the embodiment shown in FIG. 10, the array substrate 90 is a top emission type OLED array substrate. Light emitted from the luminescent material layer 982 is emitted out in a direction away from the base substrate 91, and the photoresistor is disposed in an optical path of the light emitted from the luminescent material layer 982. For example, the photoresistor 950 of the light-detecting circuit 95 may be disposed on a side of the luminescent material layer 982 away from the base substrate 91. As shown, the photoresistor 950 may be disposed on a side of the insulating layer 99 away from the base substrate 91.

Similarly, the photoresistor 950 may be disposed at any position of a light-emitting region of a sub-pixel as long as it can receive the light emitted from the corresponding sub-pixel. For example, the photoresistor 950 may be disposed at a central position of the sub-pixel in its longitudinal direction. Alternatively, the photoresistor 950 may be disposed at a central position of the sub-pixel in its lateral direction. Alternatively, the photoresistor 950 may be disposed at an edge position of the light-emitting region of the sub-pixel.

Other structures, light-detecting processes, and compensation processes for the top emission type OLED array substrate are the same as or similar to those described above for the bottom emission type OLED array substrate, and are not described here again.

It is to be understood that although the embodiments of the present disclosure have been described in detail by taking OLED display panels as an example, other embodiments of the present disclosure may also be applied to a liquid crystal display panel, a quantum dot display panel, in which structures, light-detecting processes, and compensation processes are the same as or similar to those described above for the OLED array substrate, and are not described here again.

According to some embodiments of the present disclosure, there is provided a display panel, which may include the array substrate as described above.

Figure 11:
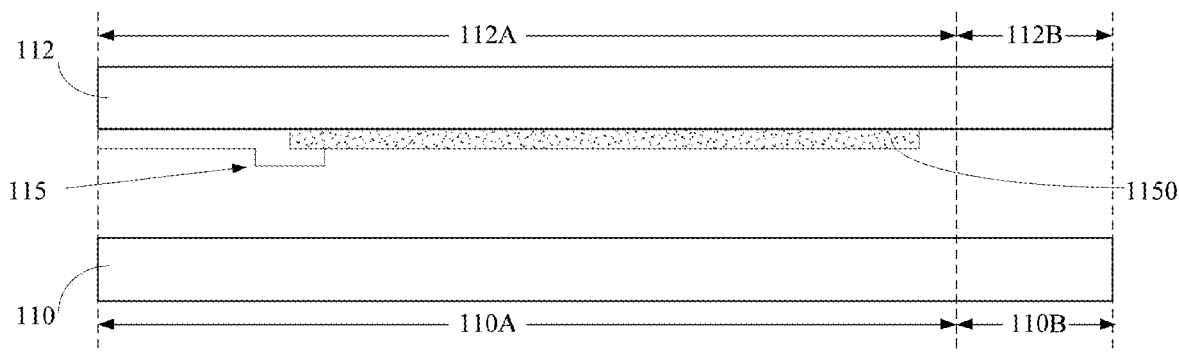
FIG. 11 is a schematic structural view of a display panel according to some embodiments of the present disclosure.

FIG. 11 illustrates a display panel according to some exemplary embodiments of the present disclosure. As shown, the display panel includes an array substrate 110, an opposite substrate 112 disposed opposite to the array substrate 110, and a light-detecting circuit 115 disposed on the opposite substrate 112. The array substrate 110 may include a plurality of pixel regions arranged in an array, the pixel region each including a light-emitting region 110A and a non-light-emitting region 110B. The opposite substrate 112 may include a first region 112A and a second region 112B. The first region 112A corresponds to the light-emitting region 110A, and the second region 112B corresponds to the non-light-emitting region 110B, that is, an orthographic projection of the first region 112A on the array substrate 110 coincides with an orthographic projection of the light-emitting region 110A on the array substrate 110, and an orthographic projection of the second region 112B on the array substrate 110 coincides with an orthographic projection of the non-light-emitting region 110B on the array substrate 110.

The light-detecting circuit 115 includes a photoresistor 1150 that is located in the first region 112A of the opposite substrate 112. Other structures, light-emitting processes, and compensation processes of the light-detecting circuit are the same as those of the foregoing embodiments, and are not described here again. In these embodiments, by arranging the light-detecting circuit, particularly the photoresistor, on the opposite substrate instead of the array substrate, it is advantageous to simplify the structure of the array substrate.

According to some embodiments of the present disclosure, the array substrate 110 may be a top emission type OLED array substrate. In the top emission type OLED array substrate, in order to avoid an exposure process from damaging the OLED luminescent material layer which has been formed, no exposure process is generally performed after the OLED luminescent material layer is formed. However, a pattern of the photoresistor is typically formed by using a patterning process including exposure. In these embodiments, by forming the light-detecting circuit, particularly the photoresistor, on the opposite substrate, it is possible to avoid the formation of the photoresistor from affecting the OLED luminescent material layer on the array substrate, thereby facilitating the manufacturing process.

Figure 12:
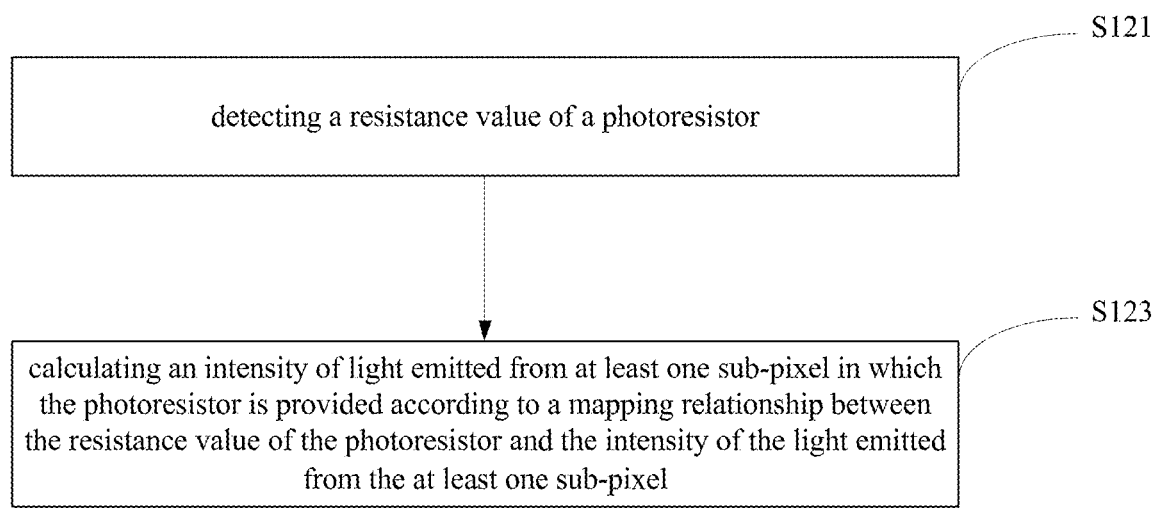
FIG. 12 is a flowchart of a light-detecting method for a display panel according to some embodiments of the present disclosure.

In another aspect, according to some embodiments of the present disclosure, a light-detecting method for a display panel is also provided. As shown in FIG. 12, the light-detecting method may include the following steps:

S121, detecting a resistance value of a photoresistor; and

S123, calculating an intensity of light emitted from at least one sub-pixel in which the photoresistor is provided according to a mapping relationship between the resistance value of the photoresistor and the intensity of the light emitted from the at least one sub-pixel.

For example, in step S121, by using the above equations (6) and (7), the resistance value of the first photoresistor 150B disposed in the blue sub-pixel may be detected; or the resistance value of the second photosensitive 150G disposed in the green sub-pixel may be detected; or the resistance value of the third photoresistor 150R disposed in the red sub-pixel may be detected.

For another example, in step S121, by using the above equations (6) and (7), the resistance value of the first photoresistor 150B disposed in the white sub-pixel may be detected, and the resistance value of the second photoresistor 150G disposed in the white sub-pixel may be detected, and the resistance value of the third photoresistor 150R disposed in the white sub-pixel may be detected.

For example, in step S123, the mapping relationship between the resistance value of the photoresistor and the intensity of the light emitted from the at least one sub-pixel in which the photoresistor is provided may include a mapping relationship established according to the above equation (5). According to the mapping relationship between the resistance value or the change in resistance value of the first photoresistor 150B and the intensity of the light emitted from the blue sub-pixel in which the first photoresistor 150B is provided, the intensity of the light emitted from the blue sub-pixel may be calculated. Alternatively, according to the mapping relationship between the resistance value or the change in resistance value of the second photoresistor 150G and the intensity of the light emitted from the green sub-pixel in which the second photoresistor 150G is provided, the intensity of the light emitted from the green sub-pixel may be calculated. Alternatively, according to the mapping relationship between the resistance value or the change in resistance value of the third photoresistor 150R and the intensity of the light emitted from the red sub-pixel in which the third photoresistor 150R is provided, the intensity of the light emitted from the red sub-pixel may be calculated.

For another example, in step S123, the mapping relationship between the resistance value of the photoresistor and the intensity of the light emitted from the at least one sub-pixel in which the photoresistor is provided may include a mapping relationship established according to the above equation (9). In other words, an intensity of the light emitted from the white sub-pixel may be calculated according to a first mapping relationship between the resistance value of the first photoresistor 150B and the intensity of the light emitted from the white sub-pixel, a second mapping relationship between the resistance value of the second photoresistor 150G and the intensity of the light emitted from the white sub-pixel, and a third mapping relationship between the resistance value of the third photoresistor 150R and the intensity of the light emitted from the white sub-pixel.

Other processes and specific details of the light-detecting method according to the embodiments of the present disclosure may refer to the above embodiments, and details are not described here again.

Figure 13:
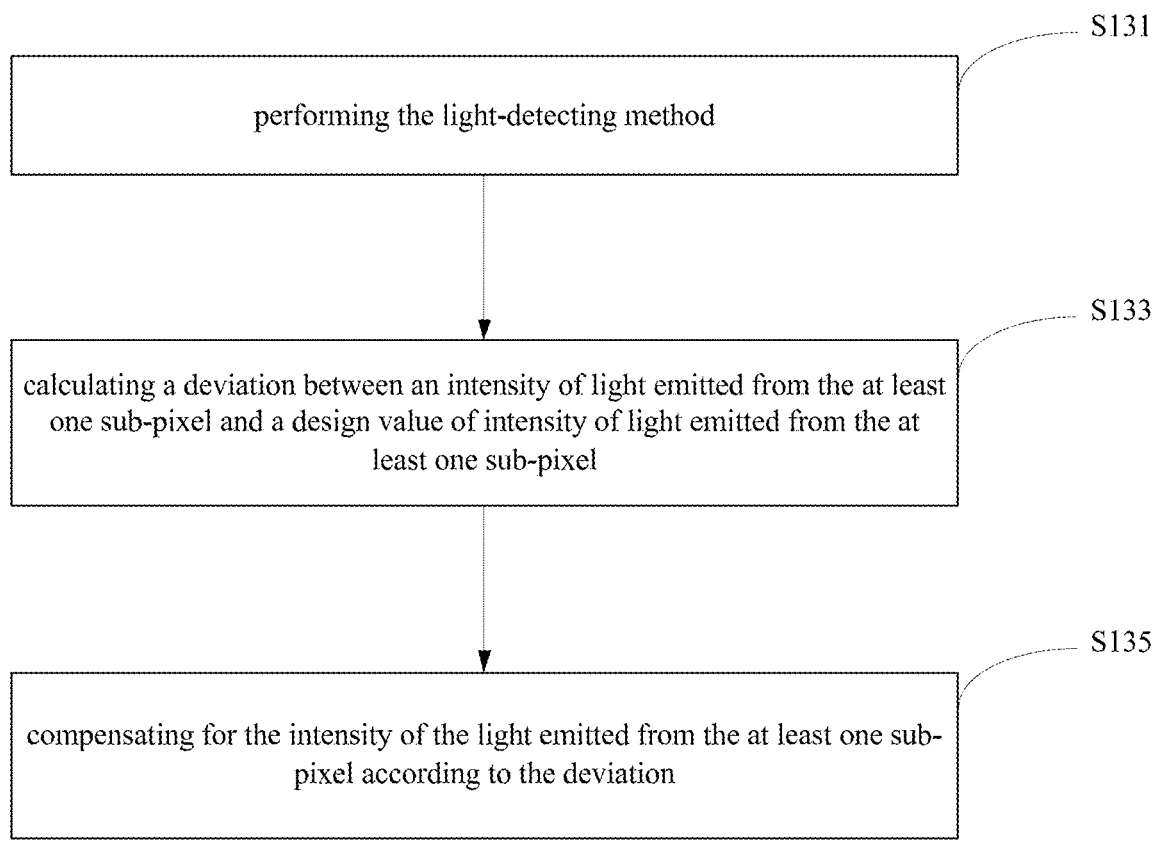
FIG. 13 is a flowchart of a method for controlling a display panel according to some embodiments of the present disclosure.

In a further aspect, according to some embodiments of the present disclosure, a method for controlling a display panel is provided. As shown in FIG. 13, the method for controlling a display panel may include the following steps:

S131, performing the light-detecting method as described above;

S133, calculating a deviation between an intensity of light emitted from the at least one sub-pixel and a design value of intensity of light emitted from the at least one sub-pixel; and S135, compensating for the intensity of the light emitted from the at least one sub-pixel according to the deviation.

For example, as for the blue sub-pixel, in step S133, the weight coefficient $M_1$ of the blue light actually emitted from the blue sub-pixel may be compared with the design value $M_0$ of the weight coefficient; and in step S135, if it is determined that $M_1 > M_0$ through the comparison, an intensity of the blue light emitted from the blue sub-pixel may be reduced when the next frame is displayed, and if it is determined that $M_1 < M_0$ through the comparison, an intensity of the blue light emitted from the blue sub-pixel may be increased when the next frame is displayed. In this way, the light emitted from the blue sub-pixel may be compensated so that the light emitted from the blue sub-pixel satisfies design requirements, thereby achieving uniform luminance of the entire display panel.

For another example, for the white sub-pixel, the weight coefficients M, N and P of blue light, green light and red light in the light actually emitted from the white sub-pixel are respectively compared with the designed weight coefficients $M_0$, $N_0$ and $P_0$ of blue light, green light and red light, so as to determine a deviation of the blue light, a deviation of the green light and a deviation of the red light in the light actually emitted from the white sub-pixel. Thereafter, a compensation may be accordingly performed for these deviations. For example, if the weight coefficients M, N and P of blue light, green light and red light in the light actually emitted from the white sub-pixel are respectively equal to 1, 0.4, 0.6 through the calculation, and the designed weight coefficients $M_0$, $N_0$ and $P_0$ of blue light, green light and red light in the light emitted from the white sub-pixel are respectively equal to 1, 0.5, 0.5, then, in following frame display, light actually emitted from the white sub-pixel needs to be adjusted, for example, to increase an intensity of the green light and reduce an intensity of the red light, so that the light actually emitted from the white sub-pixel reaches a design value, thereby improving display uniformity.

Other processes and specific details of the method for controlling a display panel according to the embodiments of the present disclosure may refer to the above embodiments, and details are not described here again.

While some embodiments according to a general inventive concept of the present disclosure have been shown and described, it is to be understood by those skilled in the art that changes may be made to these embodiments without departing from a principle and a spirit of the general inventive concept of the present disclosure, and the scope of the present disclosure shall be defined by the claims and their equivalents.

What is claimed is:

1. An array substrate comprising:
a base substrate;
a plurality of pixel regions arranged in an array on the base substrate, the pixel regions each comprising a light-emitting region; and
a light-detecting circuit in at least one pixel region, the light-detecting circuit configured to detect light emitted from the light-emitting region of the at least one pixel region in which the light-detecting circuit is provided,
wherein the light-detecting circuit comprises a photosensitive element and an auxiliary circuit coupled to the photosensitive element, the photosensitive element located in the light-emitting region of the at least one pixel region; and
wherein the plurality of pixel regions comprise at least one white sub-pixel, the white sub-pixel configured to emit white light, and wherein the photosensitive element comprises a first photoresistor, a second photoresistor and a third photoresistor, and the first photoresistor, the second photoresistor and the third photoresistor are all located in a light-emitting region of the white sub-pixel.

2. The array substrate of claim 1, wherein the first photoresistor comprises a first photoresistor material sensitive to a first primary color, the second photoresistor comprises a second photoresistor material sensitive to a second primary color, and the third photoresistor comprises a third photoresistor material sensitive to a third primary color.

3. The array substrate of claim 1, wherein the auxiliary circuit comprises: a first transistor, a second transistor, and a third transistor; and a first capacitor, a second capacitor, and a third capacitor;
a gate electrode of the first transistor, a gate electrode of the second transistor, and
a gate electrode of the third transistor are electrically connected to a first gate scan line respectively;
one of a source electrode and a drain electrode of the first transistor, one of a source electrode and a drain electrode of the second transistor, and one of a source electrode and a drain electrode of a third transistor are electrically connected to a signal line for supplying a driving voltage respectively;
the other one of the source electrode and the drain electrode of the first transistor is electrically connected to a first end of the first photoresistor, and a second end of the first photoresistor is electrically connected to one end of the first capacitor;
the other one of the source electrode and the drain electrode of the second transistor is electrically connected to a first end of the second photoresistor, and a second end of the second photoresistor is electrically connected to one end of the second capacitor; and
the other one of the source electrode and the drain electrode of the third transistor is electrically connected to a first end of the third photoresistor, and a second end of the third photoresistor is electrically connected to one end of the third capacitor.

4. The array substrate of claim 1, wherein the first photoresistor is located at one position selected from a group consisting of a central position of the light-emitting region of the white sub-pixel in a first direction, a central position of the light-emitting region of the white sub-pixel in a second direction different from the first direction, and an edge position of the light-emitting region of the white sub-pixel;

the second photoresistor is located at one position selected from the group consisting of the central position of the light-emitting region of the white sub-pixel in the first direction, the central position in the light-emitting region of the white sub-pixel in the second direction, and the edge position of the light-emitting region of the white sub-pixel; and the third photoresistor is located at one position selected from the group consisting of the central position of the light-emitting region of the white sub-pixel in the first direction, the central position in the light-emitting region of the white sub-pixel in the second direction, and the edge position of the light- emitting region of the white sub-pixel.

5. The array substrate of claim 1, wherein the array substrate comprises a luminescent material layer on the base substrate, and an orthographic projection of the photosensitive element on the base substrate overlaps with an orthographic projection of the luminescent material layer on the base substrate.

6. The array substrate of claim 1, wherein the array substrate is a bottom emission type OLED array substrate, the bottom emission type OLED array substrate comprises a luminescent material layer on the base substrate, and the photosensitive element is disposed between the base substrate and the luminescent material layer.

7. The array substrate of claim 1, wherein the array substrate is a top emission type OLED array substrate, the top emission type OLED array substrate comprises a luminescent material layer on the base substrate, and the photosensitive element is disposed on a side of the luminescent material layer away from the base substrate.

8. A display panel comprising the array substrate of claim 1.

9. A display panel comprising:
an array substrate comprising a plurality of pixel regions arranged in an array, the pixel regions each comprising a light-emitting region;
an opposite substrate opposite to the array substrate; and
a light-detecting circuit on the opposite substrate and configured to detect light emitted from the light-emitting region of at least one of the plurality of pixel regions,
wherein the opposite substrate comprises a first region, an orthographic projection of the first region on the array substrate coinciding with an orthographic projection of light-emitting regions of the plurality of pixel regions on the array substrate,
wherein the light-detecting circuit comprises a photosensitive element and an auxiliary circuit coupled to the photosensitive element, the photosensitive element located in the first region of the opposite substrate; and
wherein the plurality of pixel regions comprise at least one white sub-pixel, the white sub-pixel configured to emit white light, and wherein the photosensitive element comprises a first photoresistor, a second photoresistor and a third photoresistor, and the first photoresistor, the second photoresistor and the third photoresistor are all located in a light-emitting region of the white sub-pixel.

10. The display panel of claim 9, wherein the array substrate is a top emission type OLED array substrate.

11. A light-detecting method for a display panel, the display panel comprising: a plurality of pixel regions arranged in an array; and a light-detecting circuit in at least one pixel region, and the light-detecting circuit comprising a photoresistor,
wherein the light-detecting method comprises:
detecting a resistance value of the photoresistor; and
calculating an intensity of light emitted from the at least one pixel region in which the light-detecting circuit is provided, according to a mapping relationship between the resistance value of the photoresistor and the intensity of the light emitted from the at least one pixel region;
wherein the plurality of pixel regions comprise at least one white sub-pixel configured to emit white light, and the light-detecting circuit comprises a first photoresistor, a second photoresistor, and a third photoresistor; and
wherein detecting the resistance value of the photoresistor comprises:
detecting a resistance value of the first photoresistor in the white sub-pixel;
detecting a resistance value of the second photoresistor in the white sub-pixel; and
detecting a resistance value of the third photoresistor in the white sub-pixel.

12. The light-detecting method of claim 11, wherein calculating the intensity of light emitted from the at least one pixel region in which the light-detecting circuit is provided according to the mapping relationship between the resistance value of the photoresistor and the intensity of the light emitted from the at least one pixel region comprises:
calculating an intensity of light emitted from the white sub-pixel, according to a first mapping relationship between the resistance value of the first photoresistor and the intensity of light emitted from the white sub-pixel, a second mapping relationship between the resistance value of the second photoresistor and the intensity of light emitted from the white sub-pixel and a third mapping relationship between the resistance value of the third photoresistor and the intensity of the light emitted from the white sub-pixel.

13. A method for controlling a display panel, comprising:
performing the light-detecting method of claim 11;
calculating a deviation between the intensity of light emitted from the at least one pixel region and a design value of intensity of light emitted from the at least one pixel region; and
compensating for the light emitted from the at least one pixel region according to the deviation.

* * * * *